(12) United States Patent
Cheng et al.

(10) Patent No.: US 9,196,477 B2
(45) Date of Patent: Nov. 24, 2015

(54) SEMICONDUCTOR DEVICE AND METHOD

(75) Inventors: Kai Cheng, Leuven (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/438,718

(22) Filed: Apr. 3, 2012

(65) Prior Publication Data

US 2013/0001507 A1 Jan. 3, 2013

Related U.S. Application Data

(60) Provisional application No. 61/472,080, filed on Apr. 5, 2011.

(51) Int. Cl.
| | |
|---|---|
| *H01L 29/06* | (2006.01) |
| *H01L 29/02* | (2006.01) |
| *H01L 21/02* | (2006.01) |
| *H01L 33/00* | (2010.01) |
| *H01L 33/06* | (2010.01) |

(52) U.S. Cl.
CPC ...... *H01L 21/02494* (2013.01); *H01L 21/0237* (2013.01); *H01L 21/0243* (2013.01); *H01L 21/0254* (2013.01); *H01L 21/02381* (2013.01); *H01L 21/02458* (2013.01); *H01L 21/02505* (2013.01); *H01L 21/02516* (2013.01); *H01L 21/02587* (2013.01); *H01L 33/007* (2013.01); *H01L 33/06* (2013.01)

(58) Field of Classification Search
USPC ............... 257/9, 79–103, 618, E21.9, E29.2, 257/E29.24
See application file for complete search history.

(56) References Cited

U.S. PATENT DOCUMENTS

| | | | | |
|---|---|---|---|---|
| 2002/0145148 | A1* | 10/2002 | Okuyama et al. | 257/88 |
| 2003/0047746 | A1* | 3/2003 | Kuniyasu et al. | 257/103 |
| 2003/0057444 | A1* | 3/2003 | Niki et al. | 257/200 |
| 2007/0200135 | A1 | 8/2007 | Wang | |
| 2009/0267098 | A1* | 10/2009 | Choi | 257/98 |
| 2010/0006878 | A1 | 1/2010 | Kim et al. | |
| 2010/0102353 | A1 | 4/2010 | Park | |
| 2010/0155704 | A1 | 6/2010 | Oh et al. | |
| 2010/0264454 | A1 | 10/2010 | Yi et al. | |
| 2010/0270651 | A1* | 10/2010 | Li et al. | 257/618 |
| 2011/0084307 | A1* | 4/2011 | Miki et al. | 257/103 |

FOREIGN PATENT DOCUMENTS

| | | |
|---|---|---|
| EP | 1 667 241 A1 | 6/2006 |
| EP | 1 901 357 A2 | 3/2008 |
| JP | 2009-59851 | 3/2009 |
| WO | WO 2007/098215 A2 | 8/2007 |
| WO | WO 2009/111790 | 9/2009 |

OTHER PUBLICATIONS

European Search Report dated Jul. 13, 2012 in European Patent Application No. 12 16 2196.
Wang et al., "Internal quantum efficiency measurement in InGaN/GaN UV LEDs with patterned sapphire substrate by photoluminescence and electroluminescence method", *Conference on Lasers and Electro-Optics (CLEO) and Quantum Electronics and Laser Science Conference (QELS)*, pp. 16-21 (2010).

\* cited by examiner

*Primary Examiner* — Fernando L Toledo
*Assistant Examiner* — Lawrence-Linh T Nguyen
(74) *Attorney, Agent, or Firm* — Knobbe, Martens, Olson & Bear LLP

(57) ABSTRACT

A semiconductor device and a method of manufacturing the device is disclosed. In one aspect, a method includes providing a substrate, providing a first epitaxial semiconducting layer on top of the substrate, and forming a one- or two-dimensional repetitive pattern, each part of the pattern having an aspect ratio in the range of about 0.1 to 50.

21 Claims, 5 Drawing Sheets

SEMICONDUCTOR DEVICE AND METHOD

CROSS REFERENCE TO RELATED APPLICATIONS

This application claims priority under 35 U.S.C. §119(e) to U.S. provisional patent application 61/472,080 filed on Apr. 5, 2011, which application is hereby incorporated by reference in its entirety.

BACKGROUND OF THE INVENTION

1. Field of the Invention

The disclosed technology relates to the field of semiconductor devices with at least one potential-jump barrier or surface barrier specially adapted for light emission and a process specially adapted for the manufacture or treatment thereof or of parts thereof.

2. Description of the Related Technology

Assemblies consisting of a plurality of individual semiconductor devices and including semiconductor devices with at least one potential-jump barrier or surface barrier, specially adapted for light emission, are known. Similarly electroluminescent light sources in general, circuit arrangements for light emitting diodes and electric lamps using semiconductor devices as light generating elements are known.

Group III-nitride-based light-emitting diodes are expected to be employed in display and general lighting applications, replacing conventional incandescent and fluorescent lighting sources in near future due to their inherent higher energy efficiency and longer lifetime. In spite of their significant improvements in internal and external quantum efficiencies of the devices, there still remain technical and economical challenges for the LEDs to be competitive in terms of performance characteristics and manufacturing costs. One of the critical technical challenges to be addressed for high-brightness and high-power operations of LEDs is a phenomenon commonly referred to as an efficiency droop, which is observed as a reduction in emission efficiency with increasing injection current under high current density conditions. Nowadays, good LED shows maximum quantum efficiency at 10-20 mA/cm$^2$ and the efficiency continuously decreases at high current density, which is a so called efficiency droop.

Efficiency-droop is a main bottleneck to achieve a high power and high efficiency LED. In an example a high power LED needs to operate at 350 mA or even at 1A. In an example a large LED chip has a feature size of 1×1 mm$^2$ whereas small ones are only 300×300 µm$^2$. Even in the case of large chips with 1×1 mm$^2$ working area, a current density will be 35 and 100 A/cm$^2$, respectively. At such a high current density level, quantum efficiency is significantly reduced.

Various documents recite III-V semiconductor structures.

US 2010264454 (A1) recites that at least partial strain relief in a light emitting layer of a III-nitride light emitting device is provided by configuring the surface on which at least one layer of the device grows such that the layer expands laterally and thus at least partially relaxes. This layer is referred to as the strain-relieved layer. In some embodiments, the light emitting layer itself is the strain-relieved layer, meaning that the light emitting layer is grown on a surface that allows the light emitting layer to expand laterally to relieve strain. In some embodiments, a layer grown before the light emitting layer is the strain-relieved layer. In a first group of embodiments, the strain-relieved layer is grown on a textured surface.

In view of strain relief the above document recites provision of a textured, non regular structure, which is only provided within a certain distance of a light emitting layer. Functionally the n-type posts or polyhedrons in the openings of a mask layer are provided for strain relief, being partially relaxed, such that the material grown in the openings has a lattice constant larger than the lattice constant of the material in contact with the substrate. The light emitting layer (quantum well) is grown over the posts/polyhedrons and replicates their expanded lattice constant. It is not clear if such a structure has further special requirements, e.g. in view of selective/non-selective growth, etc. Thereto a mask is provided, which mask remains present on/in a final structure. The mask occupies surface area which can not be used otherwise. The method recited involves as a consequence also extra steps.

WO 2009111790 (A1) recites a semiconductor emitter, or a precursor therefore. It has a substrate and one or more textured semiconductor layers deposited onto the substrate in a nonpolar orientation. The textured layers enhance light extraction, and the use of non-polar orientation greatly enhances internal quantum efficiency compared to conventional devices. Both the internal and external quantum efficiencies of emitters of the disclosure can be 70-80% or higher. The disclosure provides highly efficient light emitting diodes suitable for solid state lighting.

This document recites a structure that is deposited on a very specific substrate, namely R-plane sapphire. Such a structure is seldom used, and teachings from the document can therefore typically not be applied to methods and products typically used in the field. Further, the textured structure has no further requirements.

US 2010006878 (A1) recites a semiconductor light emitting device having a patterned substrate and a manufacturing method of the same. The semiconductor light emitting device includes a substrate; a first conductivity type nitride semiconductor layer, an active layer and a second conductivity type nitride semiconductor layer sequentially formed on the substrate, wherein the substrate is provided on a surface thereof with a pattern having a plurality of convex portions, wherein out of the plurality of convex portions of the pattern, a distance between a first convex portion and an adjacent one of the convex portions is different from a distance between a second convex portion and an adjacent one of the convex portions.

The above document recites improvement of optical output, by improving a wave guide. The wave guide is improved by providing a rough surface, having a layer bump. Such a layer bump increases a surface area. Thereby injection efficiency is improved, and as a consequence the output is improved.

US 2010155704 (A1) recites a nitride semiconductor light emitting device, and a method of manufacturing the same are disclosed. The nitride semiconductor light emitting device includes a substrate, an n-type nitride semiconductor layer disposed on the substrate and including a plurality of V-shaped pits in a top surface thereof, an active layer disposed on the n-type nitride semiconductor layer and including depressions conforming to the shape of the plurality of V-shaped pits, and a p-type nitride semiconductor layer disposed on the active layer and including a plurality of protrusions on a top surface thereof. Since the plurality of V-shaped pits is formed in the top surface of the n-type nitride semiconductor layer, the protrusions can be formed on the p-type nitride semiconductor layer as an in-situ process. Accordingly, the resistance to ESD, and light extraction efficiency are enhanced.

The V-shaped pits are formed by etching, whereby dislocations in a material become visible. These dislocations are unwanted in general, as they deteriorate quality of a final semiconductor structure/device. Even further, forming these pits is by nature random, as dislocations are formed at random. As in the previous document, the structure is aimed at improving light extraction efficiency, such as by improving a wave guide. Such V-shaped etch-pits eventually seem to appear as bumps or protrusions on a (top) surface.

Certain inventive aspects of this disclosure therefore relates to a method of manufacturing a semiconductor device and the device similar to those in the introduction, which overcomes one or more of the above disadvantages, without jeopardizing functionality and advantages.

SUMMARY OF CERTAIN INVENTIVE ASPECTS

Certain inventive aspects relate to good semiconductor devices and methods for making them. It is an advantage of certain inventive aspects that methods are provided for manufacturing devices having a high break down voltage, the devices having a high current but low carrier density.

Where reference is made to a high breakdown voltage, reference may be made to a voltage in the range of about 2500V to 3000V. Where reference is made to a high current density, reference may be made to a current density that is in the range of about 35 to 100 A/cm$^2$.

Where reference is made to a low carrier density, reference is made to a carrier density that is lower, e.g. can be down to about 50%, than the carrier density of corresponding conventional devices made without the surface repetitive pattern described.

One inventive aspect relates in a first aspect to a method for manufacturing a semiconductor device, comprising: a) providing a substrate, such as a Si, SiC, Ge, sapphire substrate, and combinations thereof, advantageously a Si substrate, such as a <111> Si substrate, b) providing a first epitaxial semiconducting layer on top of the substrate, such as a III-V layer, such as a III-N layer, and c) forming a one- or two-dimensional repetitive pattern, each part of the pattern having an aspect ratio in the range of about 0.1 to 50, wherein the pattern is preferably formed in the substrate or in the first epitaxial semiconducting layer.

In some embodiments, step c) may be carried out before step b) and the pattern may be formed in the substrate, or step c) may be carried out after step b) and the pattern is formed in the first epitaxial semiconducting layer.

The method further may comprise, following step c), providing a second epitaxial semiconducting layer, such as a III-V layer, wherein advantageously a surface orientation of the III-V layer is selected from {1101}, {0002}.

The pattern may have a width in the range of about 0.5 to 5 μm, and/or a space between the pattern may have a length in the range of about 0.5 to 5 μm, and/or the pattern may be selected from one or more of a trench, a pit, a slit, a pillar, a pyramid, a square, a rectangle, a hexagon, a multigon, a circle, and an ellipse, and/or the pattern may have a depth in the range of about 0.2 to 2 μm.

The method may further comprise forming a buffer layer on the substrate before forming the first epitaxial semiconducting layer, which buffer layer comprises one or more of an initial layer formed on the substrate, preferably a layer comprising an III-N material, such as AN, and a second layer forming a buffer comprising AlGaN, wherein the Al content decreases from bottom to top.

Two or more first III-V epitaxial semiconducting layers may be provided. The two or more first II-V epitaxial semiconducting layers may be one n-type III-V layer and two or more further III-V layers. The two or more further III-V layers may form a stack of alternating III-V layers of two or more types, such as of a first and a second type and an optional third type, wherein the stack provides a multiple quantum well.

Two or more second III-V epitaxial semiconducting layers may be provided.

One inventive aspect relates to a semiconductor device, e.g. a high current low carrier density semiconductor device having a high break down voltage, the semiconductor device comprising a substrate, a first epitaxial semiconducting layer on top of the substrate, such as a III-V layer, and a one- or two-dimensional repetitive pattern, each part of the pattern having an aspect ratio in the range 0.1 to 50.

The substrate may be a Si, SiC, Ge, sapphire substrate, and combinations thereof. In view of semiconducting manufacturing methods in an example the substrate is compatible with such a process, e.g. a Si, SOI, SiC, SiGe, and Ge substrate, preferably a Si substrate. In an example the substrate is a <111> substrate.

Specifically a high current low carrier density semiconductor device having a high break down voltage is provided, e.g. obtained using a method as described above. It is noted that for a LED device operation voltage may be relatively low, such as about 1-10 V, such as about 4 V. A LED is also provided. The current density of the present device is about 1-500 A/cm$^2$, particularly about 5-250 A/cm$^2$, more particularly about 10-150 A/cm$^2$, such as about 25-50 A/cm$^2$. At present a good internal quantum efficiency is achieved at about 10-20 A/cm$^2$. One inventive aspect relates to a device with high efficiency at high current density, such as >about 30A/cm$^2$ or even >about 50A/cm$^2$. In general, it is preferred to obtain a quantum efficiency close to 1 or as high as possible at high current density level. The higher, the better. Such is achieved at an internal quantum efficiency (IQE) of more than about 50%, particularly more than about 80%, or more than about 90%, which is regarded extremely high for the present type of device. In other words, the present device provides a significantly increased internal quantum efficiency. Also the IQE remains more or less constant at higher current densities, such as above about 5 A/cm$^2$. On the other hand, by providing an increased surface for a current the current density remains relatively low, in other words, the carrier density is relatively low. The current, being a product of surface and current density (per unit surface area), is in the present device relatively high, as a consequence of the sophisticated structure of the device. Also, the device still has a very high break down voltage, such as above about 1000 V, or even above about 2000 V, such as above about 2500 V. As a consequence the present device is particularly suited for high power use.

The first epitaxial semiconducting layer on top of the substrate has a small quantum well, such as below about 20 nm, below about 10 nm, below about 5 nm, or below about 2 nm.

The first epitaxial semiconducting layer may directly on top of the substrate, or an intermediate layer or stack of layers may be present, such as a buffer layer.

The term "layer" may refer to a single layer, to a stack of layers, to a layer having a gradual change in composition, and to a combination hereof.

In an example the first epitaxial semiconducting layer is a III-V layer such as a III-N layer. In a further example the layer is a GaN layer, such as in view of further remarks below.

The first epitaxial layer preferably may have a low internal piezoelectric field of about 1MV/cm and/or a semi-polar surface having a small magneto-electrical component perpendicular to a surface thereof. In an example a III-V layer is chosen, having an {0002} surface, and/or internal {1100} and/or {1120} faces, which is virtual face of a crystal structure being present in the layer.

The device further may comprise a second epitaxial semiconducting layer on top of the first epitaxial semiconducting layer.

The pattern may have a width in the range of about 0.5 to 5 µm, and/or a space between the pattern may have a length in the range of about 0.5 to 5 µm, and/or the pattern may be selected from one or more of a trench, a pit, a slit, a pillar, a pyramid, a square, a rectangle, a hexagon, a multigon, a circle, and an ellipse, and/or the pattern may have a depth of about 0.2-2 µm.

The repetitive pattern is in an example formed by a lithographic process, or by e-beam. Depending on dimensions of the pattern a suitable lithographic process may be chosen, for instance having a suited wavelength, chemistry, and so on.

With "a one- or two-dimensional repetitive pattern" a pattern is indicated that repeats itself in one- or two-dimensions. In an example a period of such a repetition is equal to n units of the pattern, n being an integer and $\geq 1$, such as 1, 2, 3, ... etc., n preferably being 1; and in case of a two-dimensional pattern a period of such a repetition is equal to m units of the pattern, m being an integer and $\geq 1$, such as 1, 2, 3, ... etc., m preferably being 1. In case n (and m) is (are) equal to 1, the unit of the pattern is one element and one space in between elements. It is noted that the pattern should not be formed or provided by chance, such as in a case of etch pits, wherein location of an etch pit is determined by a dislocation. As a consequence etch pits are in general randomly distributed over a surface.

A "part of the pattern" refers to a repeating unit thereof.

As a consequence of each part of the pattern having an aspect ratio in the range of about 0.1 to 50 an effective surface area, especially of an active area is increased by about 50% or more, particularly by about 75% or more, by about 90% or more, by about 100% or more, such as by about 200%. In an example the aspect ration is between about 1-25, such as between about 2-10.

With the term "aspect ratio" of a shape, such as the present patter, the ratio of its longer dimension to its shorter dimension is indicated.

Throughout the disclosure, the term "layer" also refers to a stack of layers, i.e. two or more layers. Such a stack may also comprise one or more layers having a (semi-) continuous gradient in chemical composition, such as an $Al_xGa_yN$ layer initially having 100% Al (x=1) and 0% Ga (y=0) and finally having 0% Al (x=0) and 100% Ga (y=1). Such a stack may also comprise alternating layers, having a specific chemical composition, e.g. a first n-GaN layer, a second InGaN layer, a third GaN layer, a fourth InGaN layer, etc. Also combinations are possible.

One inventive aspect relates to an electronic circuit comprising a semiconductor device as described above. The electronic circuit may be for example any of the above, such as a transistor, a FET, a HEMT, a DHFET, a LED, a diode, and a power device.

One inventive aspect relates to an apparatus comprising a semiconductor device as described above and/or an electronic circuit as described above. The apparatus may for example be any of an electronic circuit, a switch, a high power application, a high voltage application, an image sensor, a biosensor, or an ion sensor.

One inventive aspect relates to the use of an apparatus as described above and/or the use of a semiconductor device as described above and/or an electronic circuit as described above in a high power application and/or a high voltage application.

In an example a high power LED that operates at about 350 mA or even at about 1A is provided. In an example a large LED chip with a feature size of about 1×1 mm² is provided. In an example a LED with a current density of about 25-250 $A/cm^2$ is provided, such as from about 35-100 $A/cm^2$. Quantum efficiency thereof is significantly improved.

The present device provides an increased area (which induces lower areal carrier density) and uses a semi-polar surface in an example, having a low internal piezoelectric field, which allows to grow thicker III-V quantum wells, such as InGaN wells, because, as has been found experimentally, of a less pronounced QCSE (quantum confined stark effect).

Advantages of the present description are detailed throughout the description.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
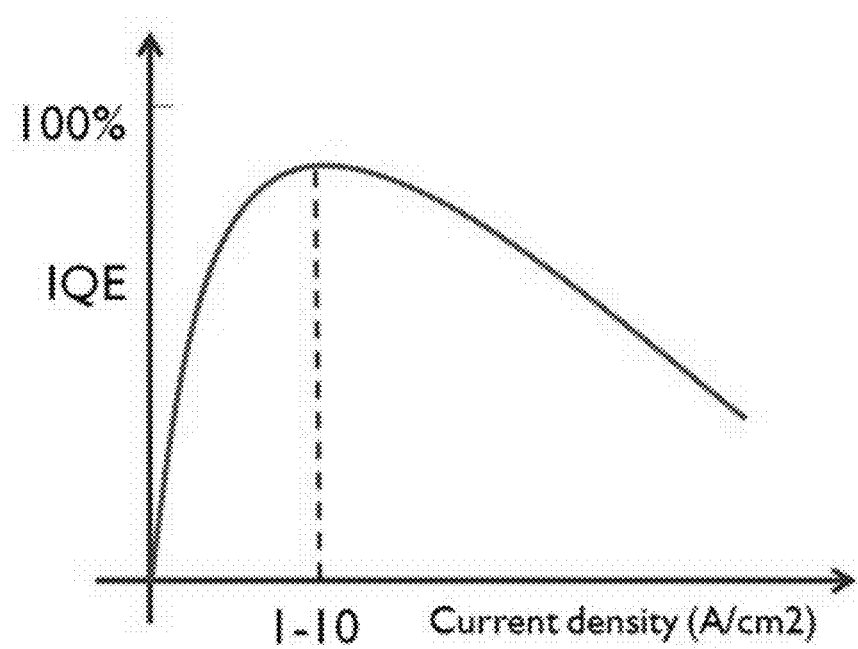
FIG. 1 shows internal quantum efficiency versus current density of a prior art device.
Figure 2A:
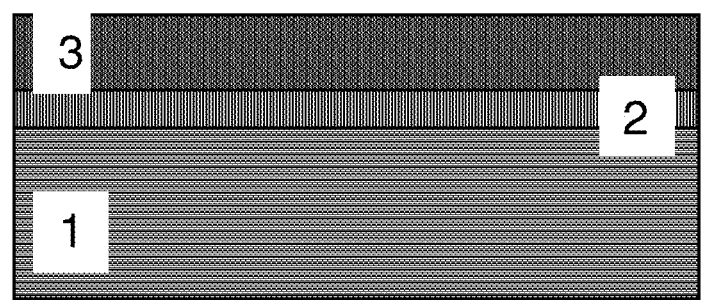
FIGS. 2a-2d show cross sections of a device manufactured using a method according to an embodiment of the present invention.
Figure 2B:
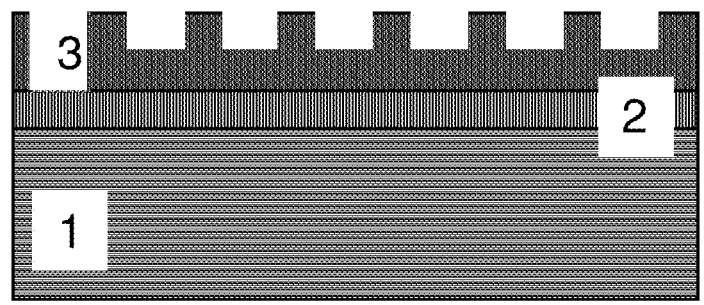
Figure 2C:
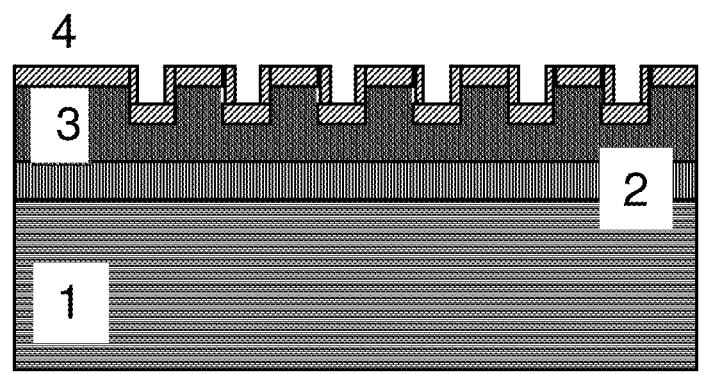
Figure 2D:
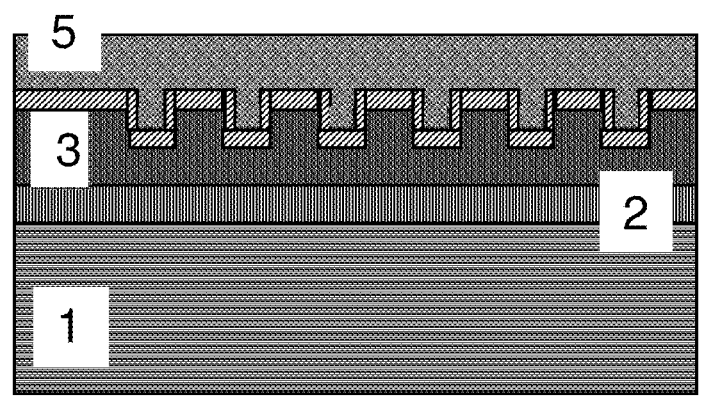
Figure 3A:
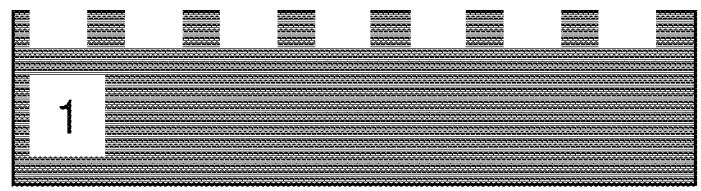
FIGS. 3a-3d show cross sections of a device manufactured using a method according to an embodiment of the present invention.
Figure 3B:
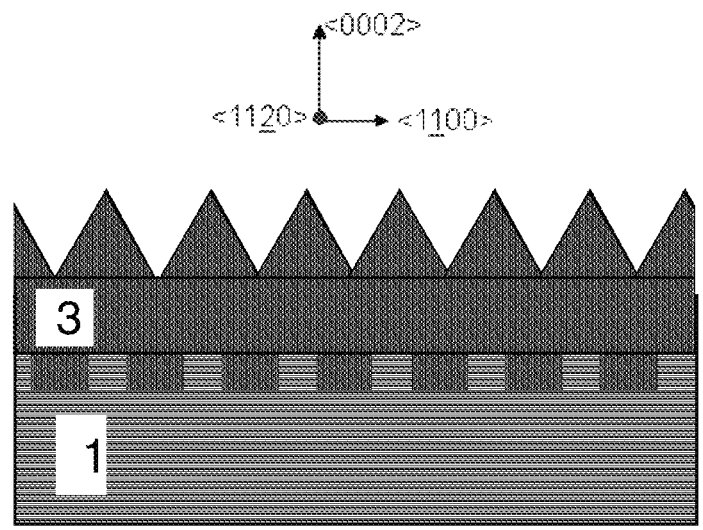
Figure 3C:
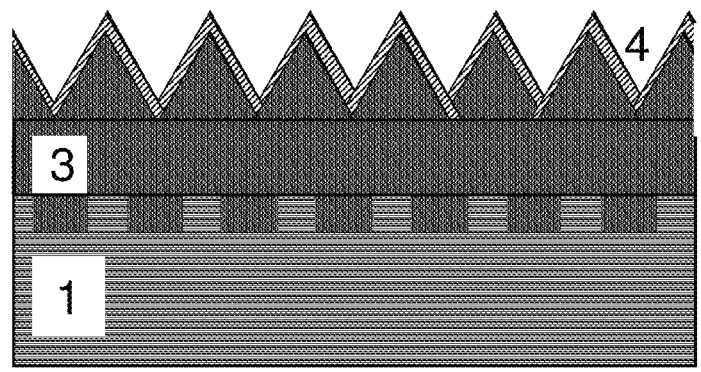
Figure 3D:
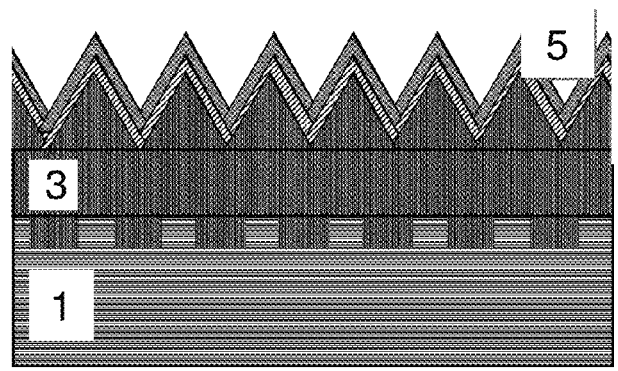

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Certain embodiments relate in a first aspect to a method for manufacturing a semiconductor device, comprising: a) providing a substrate, such as a Si, SiC, Ge, sapphire substrate, and combinations thereof, such as a Si substrate, such as a <111> Si substrate, b) providing a first epitaxial semiconducting layer on top of the substrate, such as a III-V layer, such as a III-N layer, and c) forming a one- or two-dimensional repetitive pattern, each part of the pattern having an aspect ratio of about 0.1-50, wherein the pattern is preferably formed in the substrate or in the first epitaxial semiconducting layer.

In an example the first epitaxial semiconducting III-N layer is an $Al_xGa_yN$ layer ($x,y \in \{0,1\}$), such as GaN, In an example the layer is doped, such as n-type doped. A doping concentration may be in the range of about $10^{14}/cm^3$ to $10^{17}/cm^3$. In an example doping concentration may be in the range of about $1*10^{15}/cm^3$ to $6*10^{16}/cm^3$. Such doping concentration also may be used for p-type doping.

In an example the pattern has an aspect ratio in the range of about 1 to 30, such as in the range of about 2 to 25, for example in the range of about 5 to 10. The aspect ratio advantageously increases the surface area of the pattern. In this respect the aspect ratio may be large. However, the upper limit for the aspect ratio may be defined in view of other characteristics.

The pattern may be formed using any suitable technique, such as using lithography, using wet etching, using dry etching, . . . . Patterns can be made in a two-step sequence of masking and etching. For masking, typically a layer of photo-sensitive resist is deposited which can be shaped into an etch mask using optical lithography or e-beam. For this shaping, standard masks such as $SiO_2$ or SiN masks can be used. A cheaper alternative is nano-embossing in which a pattern is made in a soft layer such as a polymer by pressing a master die with the negative of the desired mask pattern against this soft malleable layer. Either hot or cold nano-embossing could be used, of which hot embossing is most suitable for single layer printing. Conventional stamps are perfectly suitable. In a next step, the surface is etched through the openings in this masking layer. Etching can be done with a suitable wet etching solution well known to people skilled in the art, or by means of dry-etch techniques following recipes well known to people skilled in the art. A suitable chemistry is chosen to provide such an aspect ratio. Suitable etch processes are preferentially non-isotropic or uni-directional, which means it should etch only in the vertical direction irrespective of the crystalline orientation of the substrate or epitaxial layer. The etch chemistry has also to be adapted to the material which has to be etched, for example Si in the substrate or III-N if the epi layer will be patterned. Some examples may be a TMAH (tetramethyl ammonium hydroxide) etchant for GaN or a KOH (potassium hydroxide) etchant for Si.

According to one example of an embodiment of the present invention, a method is provided whereby forming a pattern is applied prior to the deposition of a first epitaxial semiconducting layer such that the pattern is formed in the substrate. According to another example of an embodiment of the present invention, forming a pattern is performed after the provision of the first epitaxial semiconducting layer, and the pattern is formed in the first epitaxial semiconducting layer.

The above two situations are illustrated with examples, whereby depending on the example, first a pattern is provided, i.e. in the substrate, or first a first epitaxial layer is provided, wherein a pattern is provided.

In the first case a surface having a protruded shape is provided followed by epitaxial growing. In the second case a patterned first epitaxial layer is provided followed by conformal growth, wherein after further steps a flat surface is obtained. In both cases however an active surface area is increased significantly.

Depending on the example a suited patterning is provided, e.g. in terms of lithography, chemistry, etc. Depending on optional further steps, manufacturing technology used, etc., an option may be chosen, such as one that is compatible with the technology.

In another example, an embodiment of the present invention relates to a method, further comprising following the step of forming a pattern and providing a first epitaxial semiconducting layer, providing a second epitaxial semiconducting layer, such as a III-V layer, wherein preferably a surface orientation of the III-V layer is selected from {1101}, {0002}

In an example the second epitaxial semiconducting layer is a III-N layer, such as an $Al_xGa_yN$ layer $(x,y \in \{0,1\})$, such as GaN, In an example the layer is doped, such as p-type doped. A doping concentration is in the order of about $10^{14}/cm^3$-$10^{17}/cm^3$. In an example doping concentration is about $1*10^{15}/cm^3$-$6*10^{16}/cm^3$.

The second epitaxial semiconducting layer may be provided directly on top of the first epitaxial semiconducting layer, or a further intermediate layer may be present.

For instance, when trenches in a (111) Si substrate are oriented parallel with an <110> direction of the substrate, then the first epitaxial layer shows facets formation. An angle of about 58 degrees is formed between the (1101), (0002) facets. In this way the surface area of the first epitaxial layer is almost double. A conformal quantum well layer overlying and in contact with this first epitaxial layer has an active area which is about two times larger than that of a planar layer.

In an example an active area is provided, e.g. by providing a second epitaxial semiconducting area. Preferably the natures of the second and first epitaxial layers are to some extend alike, i.e. similar materials are preferred. For instance, n- and p-type materials of a similar or same material may be used, such as n-type GaN and p-type GaN respectively.

In an example the substrate and/or first epitaxial layer are chosen in such a way that a {0002} surface is provided. Such a surface provides a large surface area, such as more than about 25% larger, up to about 200% larger, and further it provides a structure with a low internal piezoelectric field. Thereby thicker III-V layers can be grown, having a less pronounced QCSE, as has been found experimentally.

In an example, a method is disclosed, wherein the pattern has a width in the range of about 0.5 to 5 µm, depending on technology to be adapted, such as in the range of about 1 to 2 µm, and/or wherein a space between the pattern has a length in the range of about 0.5 to 5 µm, such as in the range of about 1 to 2 µm, and/or wherein the pattern may be selected from one or more of a trench, a pit, a slit, a pillar, a pyramid, a square, a rectangle, a hexagon, a multigon, a circle, and an ellipse, and/or wherein the pattern has a depth in the range of about 0.2 to 2 µm, such as in the range of about 0.5-1 µm.

Older technologies could relate to larger dimensions, e.g. a width in the range of about 1 to 5 µm, whereas, if required, newer technologies could relate to smaller dimensions, e.g. in the range of about 0.5 to 1 µm. A similar consideration holds for the width and depth By carefully selecting a shape of a pattern a further relative increase in surface area may be obtained, e.g. by selecting hexagonal shapes, a thin wall may remain, wherein an inner wall of the pattern adds to the surface area.

In an example shape of the pattern and surface orientation of the epitaxial layer(s) are compatible, e.g. a hexagonal, pyramid, or triangular shape combined with GaN facets, such as (1101), (0002) facets.

Also the pattern may relate to a three-dimensional structure, such as a pyramid, thereby further increasing the surface area relatively.

In an example width, depth and length of a pattern are more or less of a same magnitude, such as in the range from about 0.5 to 2 µm.

In an example, a method is disclosed that further comprises forming a buffer layer on the substrate before forming the first epitaxial semiconducting layer, which buffer layer comprises one or more of:

an initial layer formed on the substrate, preferably a layer comprising an III-N material, such as AN, and a second layer forming a buffer comprising AlGaN, wherein the Al content decreases from bottom to top.

An initial layer could be provided to overcome lattice differences between surface and further layers.

A buffer layer may provide further characteristics to the present device.

By providing further layers characteristics of a final device may be tuned to one or more requirements of such a device.

In an example, a method may use patterned pillars/pits/slits as template. A III-V structure, such as an InGaN/GaN MQW may be grown on sidewalls to increase a total active area. In this way, an efficiency droop is overcome. The patterned structure can be pits, pillars, slits, pyramids and etc. The patterned structure can be fabricated using standard lithography or a self assembled mask. For example, if Ni is annealed at high temperature, Ni films will change into nano particles. $SiO_2$ microspheres can also be used to coat the surface and form a natural mask.

In one example, by providing a specific surface orientation of the III-V layer {1101}, {0002}, etc. a relatively low internal piezoelectric field is provided. Also a quantum well effect is improved. At the same time thick layers can be grown, thereby providing a low charge carrier density, even at high current. As a consequence a high current low carrier density semiconductor device having a high break down voltage can be manufactured.

It has been found that efficiency droop is related to carrier density in the active region (quantum wells). So, a double heterostructure LED with a thick InGaN layer (~10 nm) is proposed in the prior art to reduce effective carrier density in an active region. However, because a strong internal electrical field in quantum wells leads to quantum confined Stark effect, internal quantum efficiency is reduced significantly in a thick InGaN well, in other words is disadvantageous. Some companies are using even larger chips to reduce the current density but such only relates to a technical solution, not to a practical solution. In addition, the cost will be significantly increased using large chip size.

One embodiment relates to a method, wherein two first III-V epitaxial semiconducting layers are provided, preferably one n-type III-V layer and two or more further III-V layers, and/or wherein two or more second III-V epitaxial semiconducting layers are provided.

Such layers could be provided in order to form a so-called multiple quantum well stack.

The III-V layers are in an example III-N layers, such as an $Al_xGa_yN$ layer $(x,y \in \{0,1\})$, such as GaN. In a further example the layer may be an $In_xGa_yN$ layer $(x,y \in \{0,1\})$, such as InGaN. In an example the layers may relate to a stack of alternating GaN and InGaN layers, optionally doped.

Such further layers may improve characteristics of the present device further.

The layers may have a thickness from about 20-500 nm, such as from about 50-250 nm, such as about 100 nm. In an example the thickness of GaN may be somewhat thicker than those of InGaN, such as about 250 nm and 100 nm, respectively. In an example the alternating stack comprises alternating relative tick and thin layers, such as about 250 nm and 100 nm, respectively.

By providing further layers characteristics of a final device may be tuned to one or more requirements of such a device.

In an example, the method discloses that the two or more further III-V layers form a stack of alternating III-V layers of two or more types, such as of a first and a second type and an optional third type, wherein the stack provides a multiple quantum well.

By providing further layers characteristics of a final device may be tuned to one or more requirements of such a device.

One embodiment relates in a second aspect to a high current low carrier density semiconductor device having a high break down voltage comprising a substrate, such as a Si, SiC, Ge, sapphire substrate, and combinations thereof, preferably a Si substrate, such as a <111> Si substrate, a first epitaxial semiconducting layer on top of the substrate, such as a III-V layer, and a one- or two-dimensional repetitive pattern, each part of the pattern having an aspect ratio of about 0.1-50. Details and advantages of the present device are given above and below.

One embodiment relates in a third aspect to an electronic circuit comprising a semiconductor device, such as a transistor, a FET, a HEMT, a DHFET, a LED, a diode, and a power device.

One embodiment relates in a fourth aspect to an apparatus comprising a semiconductor device and/or an electronic circuit, such as an electronic circuit, a switch, high power application, high voltage application, image sensor, biosensor, and ion sensor.

One embodiment relates in a fifth aspect to use of an apparatus and/or a semiconductor device and/or an electronic circuit in high power application and/or high voltage application.

The disclosure is further detailed by the accompanying figures, which are exemplary and explanatory of nature and are not limiting the scope of the disclosure. To the person skilled in the art it may be clear that many variants, being obvious or not, may be conceivable falling within the scope of protection, defined by the present claims.

FIG. 1 shows internal quantum efficiency versus current density of a prior art device.

FIGS. 2a-2d show cross sections of a device manufactured according to a method according to one embodiment.

Herein, first a Si, sapphire, or SiC substrate (1) is provided.

On the substrate a III-V layer (2) is provided, such as a III-V buffer layer. The buffer layer may comprise different sub-layers. In an example first an III-N layer is provided, such as an AN layer, in order to compensate for difference in lattice dimension of substrate and subsequent applied layers. Then, in a further example, other III-V layers may be provided, such as GaN/AlGaN buffer layers.

Next a first epitaxial semiconducting layer (3), such as a III-V layer, wherein preferably a surface orientation of the III-V layer is selected from {1101}, {0002}, is provided. In an example the layer is an n-type III-V layer, such as an n-type GaN layer. In an example the thickness of the layer is from about 500 nm-5 μm, such as about 2-3 μm.

Then using a mask, a regular pattern of pits is provided by etching the III-V layer, in an example using dry etch. In an example the pitch has a width of about 1 μm, a length of about 1 μm, and a depth of about 1 μm. For example for etching GaN, a Cl-based plasma chemistry can be used in combination with a SiN mask.

The increased surface area is determined by the aspect ratio 2h/(d1+d2), where h is the trench depth/the pillar height. d1 and d2 are the respective feature size of the top and bottom spacing. For example, d1, d2 and h are all 1 μm and as a consequence the surface area relating to the active area is doubled.

It is also possible to make shallow trenches in the substrates in a special orientation, for example, a <110> direction of Si(111) substrates. The trench depth could be much smaller than the trench width, for example, about 0.5 μm deep and 2 μm wide. A <110> direction of Si(111) substrates is parallel to <1120> direction of GaN. When e.g. a stripe is along this direction, the most stable facets are {1101}.

Then a thin about 100 nm thick intermediate layer (4) is provided, in an example a conformal grown InGaN layer.

Further a second epitaxial semiconducting p-type III-V layer (5) is provided, such as p-type III-N. In an example p-type GaN is provided, having a thickness from about 500 nm-5 μm, such as about 2-3 μm.

FIGS. 3a-3d show cross sections of a device manufactured according to a method of an embodiment of the present invention. Herein, first a Si, sapphire, or SiC substrate (1) is provided.

Then, using a mask, a regular pattern of pits is provided by etching the substrate, in an example using dry etch. In an example the pitch has a width of 1 μm, a length of 1 μm, and a depth of 1 μm.

On the substrate a first III-V layer (3) is provided, such as a III-V layer. The layer may comprise different sub-layers. In an example first an III-N layer is provided, such as an GaN layer, wherein preferably a surface orientation of the III-V layer is selected from {1101}, {0002}.

In an example the layer is an n-type III-V layer, such as an n-type GaN layer. In an example the thickness of the layer is from about 500 nm-5 μm, such as about 2-3 μm.

Then a thin about 100 nm layer (4) is provided, in an example a conformal grown InGaN/GaN layer.

Further an p-type III-V layer (5) is provided, such as p-type III-N. In an example p-type GaN is proved, having a thickness from about 500 nm-5 μm, such as about 2-3 μm.

As the angle between (1101) and (0002) is about 58°, the active area is almost doubled.

In addition, it has been found that a semi-polar direction has a low internal piezoelectric field, which allows to grow thicker quantum wells (e.g. InGaN wells) because of a less pronounced QCSE (quantum confined stark effect). A thick quantum well will reduce the effective carrier density further.

By increasing total active region area, an effective carrier density in the active region is reduced and consequently an efficiency droop can be reduced.

The patterned structures can be formed on GaN templates or on substrates with specific shape or orientation.

The increased area is amongst others determined by an aspect ratio of the patterned structures.

Figure 4A:
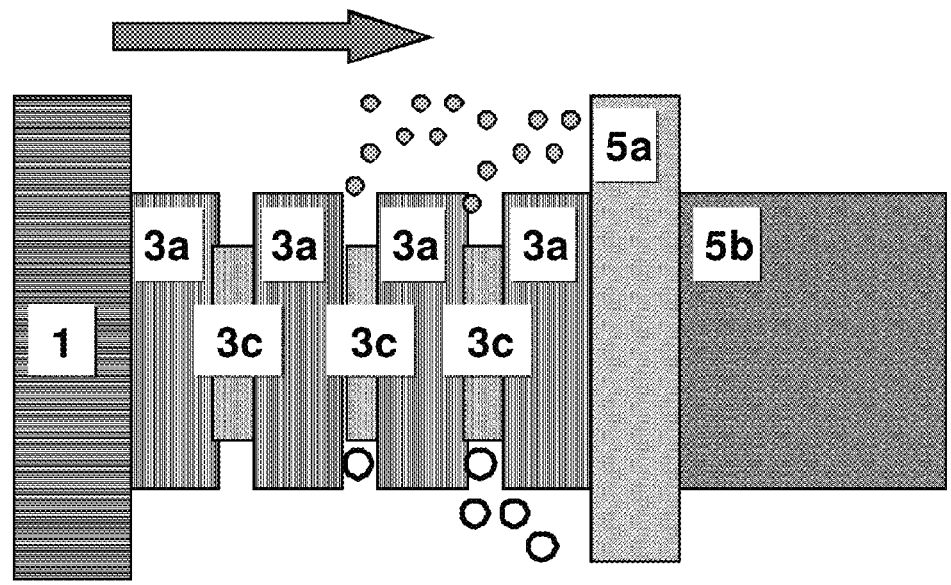
FIGS. 4a-4b show schematically in cross sections the band diagrams with the multiple quantum wells with (1) being the substrate+GaN, (3) the n-type MQW, and (5) the p-type GaN of a device manufactured using a method according to an embodiment of the present invention.
Figure 4B:
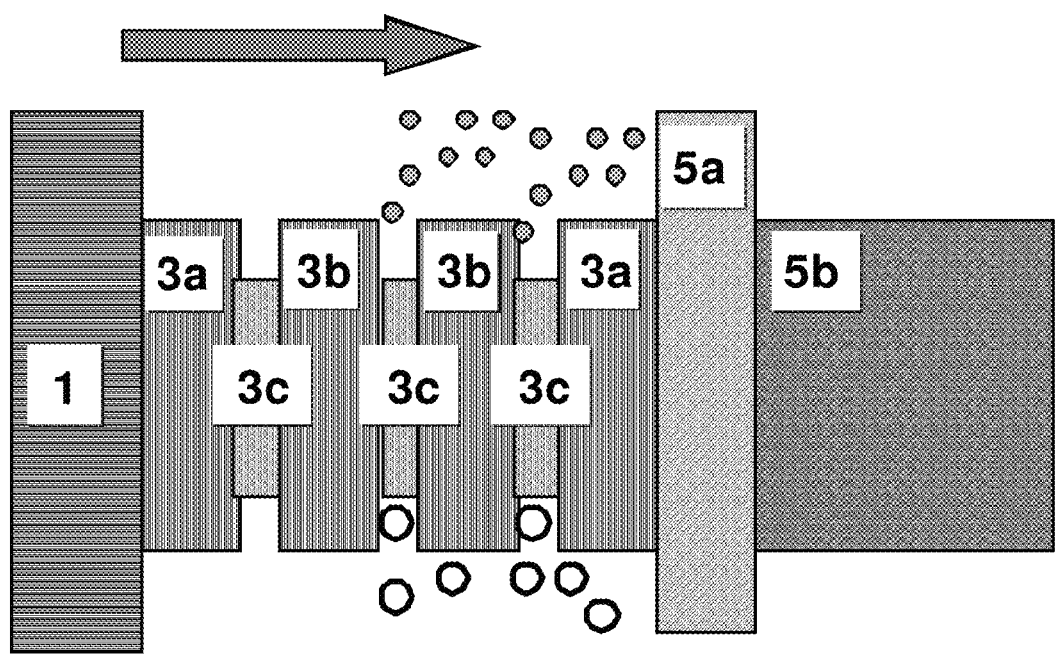

FIGS. 4a-4b show schematically in cross sections the band diagrams with the multiple quantum wells with (1) being the substrate+GaN, (3) the n-type MQW, and (5) the p-type GaN of a device manufactured using a method according to an embodiment of the present invention. The device may in an example—with respect to substrate (1), first III-V layers (3a, 3b, 3c), and second III-V layers (5a, 5b)—be manufactured in a similar way as the devices shown in FIGS. 2 and 3, respectively. The arrow indicates subsequent layers.

Another possibility to minimize efficiency droop is to use InGaN/InGaN MQW. Due to a short diffusion length and low mobility of holes in GaN, most of light is emitted in the top single quantum well. It has been found that a GaN barrier in a MQW region is so high that the injected holes are accumulated in e.g. a top InGaN well. By using InGaN/InGaN quantum wells, the barrier height is reduced and holes have more chance to reach bottom InGaN wells. In this way, the total carrier density in the top quantum well is significantly reduced.

Figure 5:
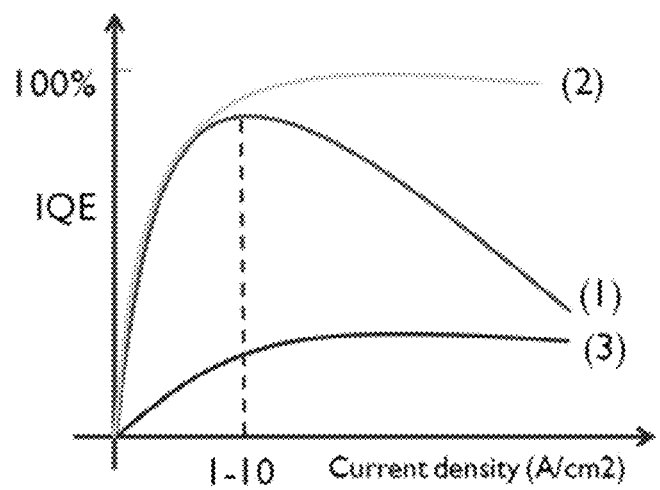
FIG. 5 shows internal quantum efficiency versus current density of a prior art device (1), of a prior art device having a low internal quantum efficiency (3) and of a device (2) according to an embodiment of the present invention.

FIG. 5 shows internal quantum efficiency versus current density of a prior art device (1), of a prior art device having a low internal quantum efficiency (3) and of the present device (2). The results of an example of one embodiment are shown as curve (2). With more defects in MQW, efficiency droop is also less pronounced but this is less or not disturbing as the absolute quantum efficiency is low.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing a semiconductor device, the method comprising:
   providing a substrate;
   providing a first epitaxial semiconducting layer over the substrate; and
   forming a periodic pattern in the first epitaxial semiconducting layer after providing the first epitaxial semiconducting layer, the periodic pattern comprising a plurality of recessed portions, the recessed portions periodically repeating in at least one direction parallel to a surface of the first epitaxial semiconducting layer, wherein the recessed portions have an aspect ratio between a depth and a lateral dimension in the at least one direction in the range of about 0.1 to 50.

2. The method according to claim 1, further comprising, subsequent to forming the periodic pattern, providing a second epitaxial semiconducting layer over the first epitaxial semiconducting layer.

3. The method according to claim 1, wherein the recessed portions have the lateral dimension in the range of about 0.5 to 5 µm.

4. The method according to claim 1, wherein the recessed portions have a depth in the range of about 0.2 to 2 µm.

5. The method according to claim 1, wherein the pattern comprises repeating structures having a shape selected from one or more of a trench, a pit, a slit, a pillar, a pyramid, a square, a rectangle, a hexagon, a multigon, a circle, and an ellipse.

6. The method according to claim 1, further comprising forming a buffer layer on the substrate before forming the first epitaxial semiconducting layer, wherein the buffer layer comprises one or more of:
   an initial layer formed on the substrate; and
   a second layer forming a buffer comprising AlGaN, wherein the Al content decreases from bottom to top.

7. The method according to claim 1, wherein two or more first III-V epitaxial semiconducting layers are provided, and/or wherein two or more second III-V epitaxial semiconducting layers are provided.

8. The method according to claim 7, wherein the two or more first III-V epitaxial semiconducting layers are two or more further III-V layers form a stack of alternating III-V layers of two or more types, wherein the stack provides a multiple quantum well.

9. A semiconductor device as manufactured according to the method of claim 1.

10. A high current low carrier density semiconductor device having a high break down voltage, the device comprising:
    a substrate;
    a first epitaxial semiconducting layer formed over the substrate; and
    a periodic pattern in the first epitaxial semiconducting layer, the periodic pattern comprising recessed portions, the recessed portions periodically repeating in at least one direction parallel to a surface of the first epitaxial semiconducting layer, the surface on an opposite side to the substrate, wherein the recessed portions have an aspect ratio between a depth and a lateral dimension in the at least one direction in the range of about 0.1 to 50.

11. The device according to claim 10, the device further comprising a second epitaxial semiconducting layer formed over the first epitaxial semiconducting layer.

12. The device according to claim 10, wherein the recessed portions have the lateral dimension in the range of about 0.5 to 5 µm.

13. The device according to claim 10, wherein the recessed portions have a depth in the range of about 0.2 to 2 µ.

14. The device according to claim 10, wherein the pattern comprises repeating structures having a shape selected from one or more of a trench, a pit, a slit, a pillar, a pyramid, a square, a rectangle, a hexagon, a multigon, a circle, and an ellipse.

15. An electronic circuit comprising a semiconductor device according to claim 10.

16. The electronic circuit according to claim 15, the electronic circuit being a transistor, a FET, a HEMT, a DHFET, a LED, a diode, or a power device.

17. An apparatus comprising a semiconductor device according to claim 10, the apparatus being an electronic circuit, a switch, a high power application, a high voltage application, an image sensor, a biosensor, or an ion sensor.

18. A method of manufacturing a semiconductor device, the method comprising:
    providing a silicon substrate;
    forming a periodic pattern in the silicon substrate, the periodic pattern comprising a plurality of recessed portions, the recessed portions periodically repeating in at least one direction parallel to a surface of the silicon substrate, wherein the recessed portions have an aspect ratio between a depth and a lateral dimension in the at least one direction in the range of about 0.1 to 50; and
    providing a first epitaxial semiconducting layer on the substrate.

19. The method of claim 18, wherein the surface of the silicon substrate has a {111} crystal plane and the recessed portions include trenches extending in a <110> direction.

20. A high current low carrier density semiconductor device having a high break down voltage, the device comprising:
- a silicon substrate;
- a periodic pattern formed in the silicon substrate, the periodic pattern comprising a plurality of recessed portions, the recessed portions periodically repeating in at least one direction parallel to the surface, wherein the recessed portions have an aspect ratio between a depth and a lateral dimension in the at least one direction in the range of about 0.1 to 50; and
- a first epitaxial semiconducting layer formed on the silicon substrate.

21. The method of claim 20, wherein the surface of the silicon substrate has a {111} crystal plane and the recessed portions include trenches extending in a <110> direction.

* * * * *